US009455767B2

(12) United States Patent
Klapper

(10) Patent No.: US 9,455,767 B2
(45) Date of Patent: Sep. 27, 2016

(54) METHOD OF MONITORING A POWER TRANSMISSION LINE AND MEASURING DEVICE

(75) Inventor: Ulrich Klapper, Rankweil (AT)

(73) Assignee: OMICRON ELECTRONICS GMBH, Klaus (AT)

(*) Notice: Subject to any disclaimer, the term of this patent is extended or adjusted under 35 U.S.C. 154(b) by 341 days.

(21) Appl. No.: 13/081,803

(22) Filed: Apr. 7, 2011

(65) Prior Publication Data

US 2011/0251806 A1    Oct. 13, 2011

(30) Foreign Application Priority Data

Apr. 8, 2010  (EP) .................. 10 003 792

(51) Int. Cl.
| G01R 21/00 | (2006.01) |
| H04B 3/54 | (2006.01) |
| H04L 1/08 | (2006.01) |
| G01R 15/14 | (2006.01) |
| H02J 13/00 | (2006.01) |

(52) U.S. Cl.
CPC ............ *H04B 3/546* (2013.01); *H04L 1/08* (2013.01); *G01R 15/142* (2013.01); *H02J 13/002* (2013.01); *H04B 2203/5495* (2013.01); *Y02E 60/727* (2013.01); *Y02E 60/7815* (2013.01); *Y02E 60/7892* (2013.01); *Y04S 10/26* (2013.01); *Y04S 40/121* (2013.01); *Y04S 40/146* (2013.01)

(58) Field of Classification Search
CPC ...... H01B 12/06; H01B 12/16; G01R 19/15; G01R 19/2513; H04L 1/08; H04B 3/546

USPC .................. 702/60, 58, 59, 61, 62
See application file for complete search history.

(56) References Cited

U.S. PATENT DOCUMENTS

| 3,978,284 A | * | 8/1976 | Yoshino et al. ................ 348/24 |
| 4,158,810 A | | 6/1979 | Leskovar |
| 5,341,088 A | * | 8/1994 | Davis ........................... 324/106 |
| 6,006,071 A | * | 12/1999 | Roberts ................. H04B 15/00 |
| | | | 455/403 |
| 7,620,517 B2 | * | 11/2009 | Scholtz et al. ................ 702/130 |
| 7,921,005 B2 | * | 4/2011 | Johnson et al. ................ 703/18 |
| 2007/0200556 A1 | * | 8/2007 | Engelhardt ................ 324/158.1 |
| 2008/0084937 A1 | | 4/2008 | Barthold et al. |
| 2008/0179070 A1 | * | 7/2008 | Gouge et al. ................ 174/15.5 |
| 2008/0204054 A1 | * | 8/2008 | Wells ........................... 324/713 |
| 2009/0187285 A1 | * | 7/2009 | Yaney ..................... G08B 25/06 |
| | | | 700/292 |
| 2011/0018704 A1 | * | 1/2011 | Burrows ....................... 340/538 |
| 2011/0178741 A1 | * | 7/2011 | Saha ............................... 702/59 |
| 2012/0199379 A1 | * | 8/2012 | Hyde et al. .................... 174/139 |

FOREIGN PATENT DOCUMENTS

| CA | 2 215 380 | 8/2006 |
| WO | WO 2007/031435 | 3/2007 |

* cited by examiner

*Primary Examiner* — Gregory J Toatley
*Assistant Examiner* — Eman Alkafawi
(74) *Attorney, Agent, or Firm* — Preti Flaherty Beliveau & Pachios LLP

(57) ABSTRACT

A method and a measuring device for monitoring a power transmission line are disclosed. Measured data are acquired by means of the measuring device at a measuring point of the power transmission line and are coupled in to said power transmission line to transmit the measured data via the power transmission line to a measured data acquisition device.

14 Claims, 1 Drawing Sheet

METHOD OF MONITORING A POWER TRANSMISSION LINE AND MEASURING DEVICE

The present invention relates to a method of monitoring a power transmission line, wherein measured parameters are acquired, in particular, along the power transmission line. The present invention further relates to a measuring device and a measured data acquisition device which are suitable for use in said method of monitoring the power transmission line.

In order to ensure reliable operation of power transmission lines, such as, for example, high voltage overhead lines, medium voltage overhead line, high voltage cables or medium voltage cables, glass fibres are conventionally incorporated into the cables or lines in order to measure their temperature. Under these circumstances, the physical properties of the glass fibres are monitored. However, this type of monitoring gives rise to high costs because of the use of glass fibres. In addition, with the aid of the glass fibres it is only possible to measure the temperature, whereas the monitoring, which is likewise desirable, of other parameters, for example partial discharges or sagging in overhead lines, is not possible.

The object of the present invention is therefore to make available an improved and more cost-effective method of monitoring power transmission lines and a corresponding measuring device.

According to an aspect of the present invention, a method of monitoring a power transmission line is made available. In said method, measured data are acquired at a measuring point in the power transmission line by means of a measuring device. The measured data acquired are coupled in to the power transmission line and transmitted, via the latter, to a measured data acquisition device. The measured data may comprise, for example, measured parameters or variables of the power transmission line such as, for example, an item of information regarding the temperature of said line, information regarding partial discharges in said line, but also information relating to a sag in overhead lines or a distance between conductors belonging to overhead lines and the ground. The sag and the distance between a conductor and the ground may, for example, be ascertained indirectly by measuring a conductor-tensioning force. The measured data transmitted may be decoupled from the power transmission line at a measured data acquisition device for evaluating the measured data.

Through the fact that the measured data are acquired at a measuring point in the power transmission line and are transmitted, via the latter, to the measured data acquisition device for evaluation, it is not necessary to use a glass fibre incorporated into said power transmission line for temperature-measuring purposes, as a result of which it is possible to save the considerable cost of the glass fibres. In addition, it is possible, by means of the measuring device, to also acquire, in addition to the item of information regarding temperature, other parameters such as, for example, an item of information regarding a partial discharge in a section of the power transmission line, and to transmit them to the measured data acquisition device via the latter for evaluation. For example, the coupling-in of the measured data may take place, particularly on high voltage cables, at a point at which the conductors of a three-phase system are crossed. The measured data may, for example, be acquired and transmitted for a conductor, a screen or jointly for a number of conductors surrounded by a common sheath.

According to an embodiment of the invention, the measured data are coupled in electrically to the power transmission line. Said measured data may, for example, be coupled in inductively to the power transmission line or may, for example, be coupled in between a screen and an internal conductor of a power transmission line of coaxial composition. In the case of high or medium voltage cables, the acquisition and coupling-in of the measured data between a screen and an internal conductor may take place, in particular, in so-called "cross-bonding boxes", since potential sources of error are particularly often present at that point and the screens of the three phases are cross-bonded at that point, as a result of which it is possible, in a simple manner, to couple in the measured data between the screen and the internal conductor or to one of the two.

Moreover, the measured data can be coupled in to the power transmission line via one or a number of screens and internal conductors jointly. In the case of this so-called "common-mode coupling", the measured data are coupled in via the entire cable, including the screen and internal conductor, and possibly even via all three phases. Measured data can therefore be coupled in even at points at which the screen and/or internal conductor are not accessible separately. In this way it is possible, for example, to monitor each sleeve of a cable in respect of temperature or partial discharge.

According to another embodiment of the invention, the measured data are transmitted by the measuring device to the measured data acquisition device in a repeatedly reiterated manner. Said repeatedly reiterated measured data can be superimposed in the measured data acquisition device. If the measured signal is transmitted and received by the measured data acquisition device in a very often repeated manner, this repetition can be used by said measured data acquisition device for averaging. If the rate of repetition and the time response of the repetition of the measured data are known, averaging of said measured data can be carried out by superimposition, as a result of which it is possible to achieve very satisfactory interference suppression. The coupling-in of the measured data can thereby take place at extremely small levels, so that surroundings and other apparatuses, for example for data transmission via the power transmission line, are not interfered with by the measured data coupled in.

In a further embodiment of the method of the invention, a synchronisation signal is transmitted to the measuring device by the measured data acquisition device via the power transmission line, and the measured data are coupled in to said power transmission line by the measuring device in dependence upon said synchronisation signal. Like the measured data, the synchronisation signal can be coupled in inductively to the power transmission line by the measured data acquisition device between the screen and internal conductor or via common-mode coupling, and may be decoupled by the measuring device in a corresponding manner. The transmission of the synchronisation signal by the measured data acquisition device to the measuring device makes an exact time base available to said measuring device in order, for example, to repeatedly emit the measured data in a temporally sychronised manner. The measuring device can be synchronised with the synchronisation signal, for example with the aid of a phase-regulating circuit, a so-called "phase-locked loop" (PLL).

According to a still further embodiment of the invention, a number of measuring devices are arranged at a number of measuring points in the power transmission line. An addressing signal, which addresses one of the number of measuring devices, is transmitted by the measured data acquisition device to the number of measuring devices via the power transmission line. On the basis of the addressing signal, the measuring device addressed couples in the measured data to the power transmission line. Like the synchronisation signal, the addressing signal can be coupled in to the power transmission line by the measured data acquisition device, for example inductively, between the screen and internal conductor or via common-mode coupling. By using the addressing signal, which unambiguously identifies one of the number of measuring devices, a number of measuring devices can be arranged at a number of different measuring points in the power transmission line and be interrogated by the measured data acquisition device in order to acquire measured data from the various measuring points in the power transmission line. With the aid of the synchronisation signal and the addressing signal, it is thereby possible in a simple manner, when using a number of measuring devices on the power transmission line, to ensure synchronised and ordered transmission of the measured data by the measuring devices to the measured data acquisition device.

According to an embodiment of the invention, the measuring device comprises a coupling unit for coupling in the measured data acquired to the power transmission line, and a further coupling unit for supplying said measuring device with power from an electrical or magnetic field of the power transmission line. Alternatively, the measuring device may comprise a coupling unit which is designed to couple in the measured data acquired to the power transmission line and to additionally provide power from the electrical or magnetic field of said power transmission line for the purpose of supplying the measuring device. It is thereby possible to supply the measuring device with power in a simple manner.

According to yet another embodiment, the measuring device comprises a coupling unit for coupling in the measured data acquired, which is additionally designed for decoupling partial discharge signals. It is thereby possible to carry out cost-effective monitoring of partial discharges.

According to a further aspect of the present invention, a measuring device for monitoring a power transmission line is also made available. Said measuring device comprises a unit for acquiring measured data along the power transmission line, and a coupling unit which is designed to couple in the measured data acquired to the power transmission line. The measuring device may also be designed in such a way that it is suitable for carrying out the method described above and its forms of embodiment.

According to another aspect of the present invention, a measured data acquisition device for monitoring a power transmission line is also made available. Said measured data acquisition device comprises a coupling unit for decoupling and evaluating measured data. The measured data may, for example, be coupled in to the power transmission line by a measuring device at a measuring point, and be transmitted via said power transmission line. The measured data acquisition device may also be designed for carrying out the method described above and its forms of embodiment.

Finally, the present invention also makes available a system for monitoring a power transmission line. Said system comprises at least one measuring device such as has been described above, and a measured data acquisition device such as has been described above.

The present invention will be explained below with reference to the drawings and with the aid of preferred forms of embodiment.

Figure 1:
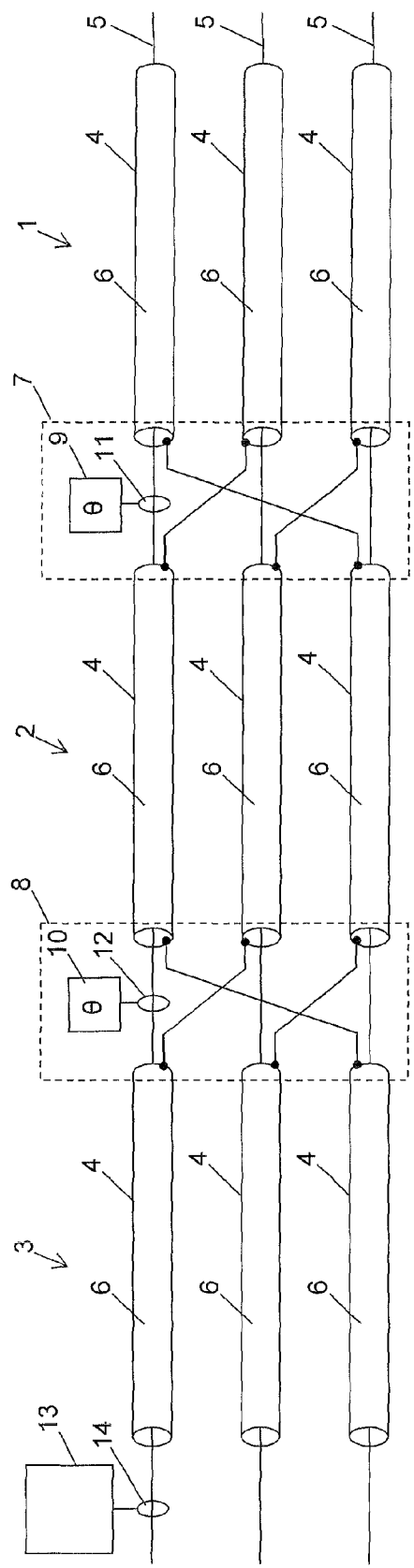
FIG. 1 shows diagrammatically a system for monitoring a power transmission line according to an embodiment of the present invention.

FIG. 1 shows three sections 1-3 of a power transmission line. Each section 1-3 of said power transmission line comprises three coaxial cables 4 at a time, each of which is composed of an internal conductor 5 and a screen 6. Each line section 1-3 is therefore suitable for transmitting a three-phase power signal. Located between the first line section 1 and the second line section 2 is a so-called "cross-bonding region" 7 in which the screens 6 of the three coaxial cables for the three phases are cross-bonded. The internal conductors 5 are therefore accessible in the cross-bonding region 7. Located between the line section 2 and the line section 3 is a further cross-bonding region 8 in which the internal conductors 5 are likewise accessible.

Measuring devices 9 and 10 are arranged in the cross-bonding regions 7 and 8 respectively, for the purpose of monitoring the power transmission line. Said measuring devices 9, 10 are designed, for example, to acquire a temperature θ of the internal conductor 5 or to acquire partial discharges within one of the coaxial cables 4. The measuring devices 9, 10 each comprise a coupling-in device 11 and 12 respectively, which is designed to couple in a measured data signal, which represents, for example, an item of information θ regarding temperature or an item of information regarding a partial discharge, to the internal conductor 5. The coupling-in of the measured data, such as for example the item of information θ regarding temperature or the item of information regarding a partial discharge, may, for example, take place inductively to the internal conductor 5. The coupling-in device 11 or 12 may also be used for the purpose of harvesting energy from the magnetic field of the internal conductor, and supplying said energy to the measuring apparatus 9 or 10 respectively. It is also possible to use a second coupling apparatus per measuring apparatus, under which circumstances one is used for recovering energy and one for coupling in measured data. In addition, the measured data can also be coupled in directly via a voltage between the internal conductor 5 and the screen 4. Furthermore, the measured data can also be coupled in, via common-mode coupling, to the entire cable 4 or to all three cables 4 jointly. This is of particular interest in the case of medium voltage cables in which all three phases are located in a common jacket. Arranged at that end of the power transmission line which is shown on the left in FIG. 1 is a measured data acquisition device 13 which is connected, via a coupling unit 14, to the internal conductor 5 of one of the coaxial cables 4. The coupling unit 14 shown in FIG. 1 is designed to decouple the measured data, which have been coupled in by the measuring devices 9, 10 to the internal conductor 5, and to make them available to the measured data acquisition device 13. Said measured data acquisition device 13 evaluates the measured data and, in this simple manner, monitors the condition of the power transmission line.

In order to ensure the ordered transmission of the measured data from a number of measuring devices 9, 10 to the measured data acquisition device 13, said measured data acquisition device 13 is designed to couple in a synchronisation signal and an addressing signal to the internal conductor 5 via the coupling unit 14. The measuring devices 9, 10, and their coupling units 11 and 12 respectively, are also designed in such a way that they can decouple the synchronisation signal and the addressing signal from the internal conductor 5. Each measuring device 9, 10 has an unambiguous address assigned to it and is in a position to compare the addressing signal received with its own address. If the addressing signal received via the internal conductor 5 corresponds with its own address, the measuring device 9, 10 couples in its measured data to said internal conductor 5. With the aid of the synchronisation signal, with which the measuring devices 9, 10 can be synchronised, for example with the aid of a phase-regulating circuit, a so-called "phase-locked loop" (PLL), a temporally regulated procedure for transmitting the addressing signals and the measured data is ensured.

Figure 2:
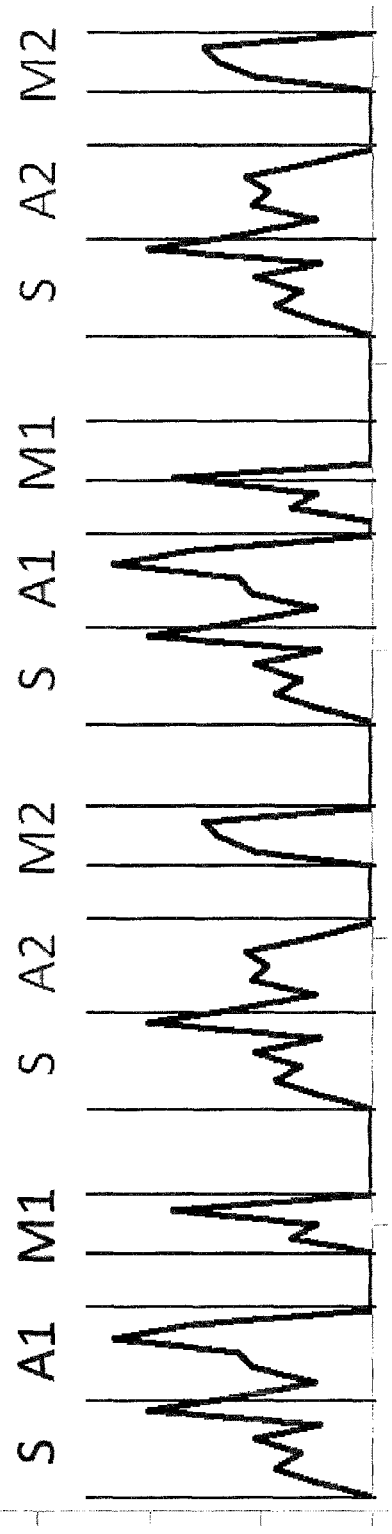
FIG. 2 shows a pattern of signals which have been coupled in to the power transmission line for the purpose of monitoring said power transmission line.

FIG. 2 shows, on an exemplary basis, how such synchronisation and addressing of, for example, two measuring devices 9, 10 proceeds. Under these circumstances, FIG. 2 shows the temporal signal pattern which is transmitted for the purpose of communicating between the measuring devices 9, 10 and the measured data acquisition device 13 via the power transmission line. First of all, the measured data acquisition device 13 couples in a synchronisation signal S to the internal conductor 5. This synchronisation signal S is received by all the measuring devices 9, 10 connected to the internal conductor 5, as a result of which the measuring devices 9, 10 and the measured data acquisition device 13 are synchronised. The synchronisation signal S is followed by an addressing signal A1. As will be shown below, there are various addressing signals which each have an unambiguous signal shape in order to address one of the measuring devices 9, 10. The addressing signal A1 has the unambiguous signal shape for addressing a first measuring device. After a short pause of predetermined length, the measuring device addressed by the addressing signal A1 then couples in its measured data M1 to the internal conductor 5. After a further pause, the measured data acquisition device 13 in turn couples in a synchronisation signal S, followed by a further addressing signal A2, to the internal conductor 5 for the purpose of addressing a second measuring device. On the basis of receiving the addressing signal A2, a second measuring device then couples in its measured data M2 to the internal conductor 5 after a short pause of predetermined length. In a system with two measuring points, the measured data acquisition device now begins again at the first measuring device with the address A1 and repeats the procedure as described above. At the measuring points, use is made of a so-called "synchronous demodulation", also "coherent modulation". Under these circumstances, the frequency with which the measured data acquisition device emits the synchronising pulses is very precisely known to the measuring points. As a result of the constant repetition of the synchronising pulse and also of the addresses, the measuring devices are able to exactly align their internal time base with that of the measured data acquisition device by means of the PLL, and thereby filter data with amplitudes of virtually any small size out of the very much greater static, if the data are only repeated often enough.

In order to ensure error-free transmission of the measured data M1 and M2, the measured data should be transmitted repeatedly to the measured data acquisition device 13 by the measuring device 9, 10. This can take place, for example, in such a way that, after the corresponding meassuring device has been addressed, the measured data are directly transmitted repeatedly, one after another, to the measured data acquisition device 13, and the measured data repeatedly received in said measured data acquisition device are superimposed in order to thus average out interference. Alternatively, the measured data acquisition device can also address each measuring device repeatedly by means of the addressing method described in connection with FIG. 2, and can retrieve the corresponding measured data repeatedly and average them by superimposition, in order to thereby achieve satisfactory interference suppression. As a result, it is possible to use extremely small levels for transmitting the measured data.

LIST OF REFERENCE SYMBOLS

1 line section
2 line section
3 line section
4 coaxial cable
5 internal conductor
6 screen
7 cross-bonding region
8 cross-bonding region
9 measuring device
10 measuring device
11 coupling unit
12 coupling unit
13 measured data acquisition device
14 coupling unit
A1, A2 addressing signal
M1, M2 measured data
S sychronisation signal

The invention claimed is:

1. A method of monitoring a power transmission line, said method comprising:
   measuring, by a measuring device, at a measuring point along the power transmission line, a characteristic associated with the power transmission line and obtaining a measured data signal representative of the characteristic associated with the power transmission line;
   periodically transmitting by a measured data acquisition unit a synchronization signal including a plurality of synchronization pulses over the power transmission line;
   receiving the synchronization pulses transmitted by the measured data acquisition unit at the measuring device;
   repeatedly transmitting the measured data signal from the measuring device over the power transmission line, wherein each of the repeatedly transmitted measured data signals is the same when transmitted by the measuring device and wherein each transmitted measured data signal is delayed in transmission from a corresponding one of the plurality of synchronization pulses;
   receiving at the measured data acquisition unit the repeatedly transmitted measured data signals; and
   averaging the received repeatedly transmitted measured data signal to obtain an averaged measured data signal indicative of a characteristic of the power transmission line at the measuring point.

2. The method according to claim 1, wherein the power transmission line comprises a high voltage overhead power transmission line and the measured data signal is representative of a sag of conductors belonging to the high voltage overhead power transmission line or a distance between a conductor of the high voltage overhead power transmission line and the ground.

3. The method according to claim 2, further comprising measuring a conductor-tensioning force by the measuring device to ascertain the sag of conductors belonging to the overhead power transmission line or the distance between a conductor and the ground.

4. The method according to claim 1, wherein the measured data signal is representative of a temperature of the power transmission line or a partial discharge in said power transmission line.

5. The method according to claim 1, further including coupling the measured data signal from the measuring device to the power transmission line via at least one of:
   electrically coupling the measured data signal to the power transmission line;
   inductively coupling the measured data signal to the power transmission line;
   coupling the measured data signal between a screen and an internal conductor of the power transmission line having a coaxial composition; and
   coupling the measured data signal to the power transmission line via one or a number of screens and internal conductors jointly.

6. The method according to claim 1, wherein a plurality of measuring devices are arranged at a plurality of measuring points on the power transmission line and each measuring device is operative to receive a measured data signal representative of a characteristic of the power transmission line at a respective one of the plurality of measuring points, each measuring device having an associated unique address, the method further comprising:
   transmitting an addressing signal containing an address to the plurality of measuring devices from the measured data acquisition unit via the power transmission line, wherein the address within the addressing signal addresses one of the plurality of measuring devices;
   at each of the plurality of measuring devices comparing the unique address of the respective measuring device to the address within the addressing signal, and
   repeatedly transmitting the measured data signal over the power transmission line from one of the plurality of measuring devices at which the address within the addressing signal matches the unique address of the respective measuring device, wherein each one of the repeatedly transmitted measured data signals is the same at a time of transmission by the respective measuring device.

7. The method according to claim 1, wherein the power transmission line comprises at least one of the group consisting of a high voltage cable, a medium voltage cable, a high voltage overhead line, and a medium voltage overhead line.

8. The method according to claim 1, further including coupling the repeatedly transmitted measured data signals to the power transmission line via a first coupling unit associated with the measuring device, and supplying the measuring device with power derived from an electrical or magnetic field of the power transmission line via a second coupling unit.

9. The method according to claim 1, further including coupling the repeatedly transmitted measured data signals to the power transmission line via a coupling device associated with the measuring device and supplying power to the measuring device from an electrical or magnetic field of the power transmission line via the coupling device.

10. The method according to claim 1, further including coupling the repeatedly transmitted measured data signals to the power transmission line via a coupling unit associated with the measuring device.

11. Apparatus for monitoring a power transmission line, said apparatus comprising:
   a measuring device operative to measure a characteristic associated with a power transmission line at a measuring point along the power transmission line and to obtain a measured data signal representative of the characteristic associated with the power transmission line;
   a measured data acquisition unit operative to transmit a synchronization signal including a plurality of synchronization pulses over the power transmission line, wherein the measuring device is operative to receive the synchronization pulses transmitted over the power transmission line, wherein:
   the measuring device is operative to repeatedly transmit the measured data signal over the power transmission line and each of the repeatedly transmitted measured data signals transmitted by the measuring device over the power transmission line is the same at a time of transmission onto the power transmission line;
   the measuring device is operative to delay transmission of each of the repeatedly transmitted measured data signals from receipt of a corresponding one of the plurality of synchronization pulses, and
   the measured data acquisition unit is operative to receive the repeatedly transmitted measured data signals over the power transmission line and to average the received repeatedly transmitted measured data signals to obtain an averaged measured data signal representative of the characteristic of the power transmission line at the measuring point.

12. Apparatus for monitoring a power transmission line, comprising:
   a measuring device having a unique measuring device address, the measuring device operative to measure a characteristic of the power transmission line at a measuring point along the power transmission line and to obtain a measured data signal representative of the characteristic of the power transmission line at the measuring point;
   a measured data acquisition unit operative to transmit a synchronization signal including a plurality of synchronization pulses over the power transmission line and wherein the measured data acquisition unit is operative to transmit an addressing signal including an address over the power transmission line,
   wherein the measuring device is operative upon receipt of the addressing signal containing an address that corresponding to the unique measuring device address to repeatedly transmit the measured data signal over the power transmission line with each transmitted measured data signal delayed in transmission from receipt of a corresponding one of the plurality of synchronization pulses, wherein each of the repeatedly transmitted measured data signals are the same as of a time of transmission by the measuring device, and
   the measured data acquisition unit being operative to receive the repeatedly transmitted measured data signals over the power transmission line and to average the received repeatedly transmitted measured data signals to obtain an averaged measured data signal representative of the characteristic of the power transmission line at the measuring point.

13. A method of monitoring a power transmission line, said method comprising:
   measuring, by a measuring device, at a measuring point along the power transmission line, a characteristic associated with the power transmission line, and obtaining by the measuring device a measured data signal representative of the characteristic associated with the power transmission line;

repeatedly transmitting the measured data signal from the measuring device over the power transmission line, wherein each of the repeatedly transmitted measured data signals is the same when transmitted by the measuring device;

receiving at the measured data acquisition unit the repeatedly transmitted measured data signals; and averaging the received repeatedly transmitted measured data signals to obtain an averaged measured data signal representative of the characteristic of the power transmission line at the measuring point.

14. Apparatus for monitoring a power transmission line comprising:

a measuring device operative to measure a characteristic of the power transmission line at a measuring point along the power transmission line and to obtain a measured data signal representative of the characteristic of the power transmission line at the measuring point, the measuring device being further operative to repeatedly transmit the measured data signal over the power transmission line, wherein each of the repeatedly transmitted measured data signals transmitted by the measuring device is the same as of a time of transmission; and a measured data acquisition unit being operative to receive the repeatedly transmitted measured data signals over the power transmission line and to average the received repeatedly transmitted measured data signals to obtain an averaged measured data signal representative of the characteristic of the power transmission line at the measuring point.

* * * * *